(12) United States Patent
Chang et al.

(10) Patent No.: US 9,196,973 B2
(45) Date of Patent: Nov. 24, 2015

(54) SOLAR JUNCTION BOX AND WIRE CONNECTING STRUCTURE THEREOF

(71) Applicant: Chicony Power Technology Co., Ltd., New Taipei (TW)

(72) Inventors: Hung-Jui Chang, New Taipei (TW); Yu-Jen Lai, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 133 days.

(21) Appl. No.: 14/198,960

(22) Filed: Mar. 6, 2014

(65) Prior Publication Data

US 2015/0255889 A1    Sep. 10, 2015

(51) Int. Cl.
| | |
|---|---|
| *H01R 9/00* | (2006.01) |
| *H01R 4/48* | (2006.01) |
| *H05K 1/18* | (2006.01) |
| *H05K 5/00* | (2006.01) |

(52) U.S. Cl.
CPC .. *H01R 4/48* (2013.01); *H05K 1/18* (2013.01); *H05K 5/0026* (2013.01); *H05K 2201/10174* (2013.01)

(58) Field of Classification Search
CPC . H01R 4/48; H05K 1/18; H05K 2201/10174; H05K 5/0026
USPC ............. 361/679.01, 752, 760, 772; 174/520, 174/522, 260, 261; 439/370, 224, 907

See application file for complete search history.

(56) References Cited

U.S. PATENT DOCUMENTS

| | | | | |
|---|---|---|---|---|
| 8,075,326 B2* | 12/2011 | Quiter | .................. | H01R 4/4809 439/224 |
| 2005/0054244 A1* | 3/2005 | Werner | ................ | H01R 13/112 439/682 |
| 2006/0289053 A1* | 12/2006 | Nieleck | .................. | H02S 40/34 136/244 |
| 2013/0280946 A1* | 10/2013 | Salzmann | ................ | H01R 4/48 439/370 |

* cited by examiner

*Primary Examiner* — Yuriy Semenenko
(74) *Attorney, Agent, or Firm* — Chun-Ming Shih; HDLS IPR Services

(57) ABSTRACT

Disclosed are a solar junction box and a wire connecting structure of the solar junction box. The solar junction box includes plural first conductive tongues separately and perpendicularly plugged onto a printed circuit board, plural solar panel conducting plates combined to the first conductive tongues, and each solar panel conducting plate including an extension plate connected to a solar panel and a U-shaped snap-in plate bent and extended from the extension plate, and each U-shaped snap-in plate being snapped onto each first conductive tongue, plural insulators sheathed on the solar panel conducting plates, a pair of second conductive tongues separately and flatly attached onto a side of the printed circuit board, and two conducting terminals electrically connected to the pair of second conductive tongues. With the installation of the wire connecting structure, the volume of the solar junction box can be reduced to provide a stable electrical connection.

17 Claims, 4 Drawing Sheets

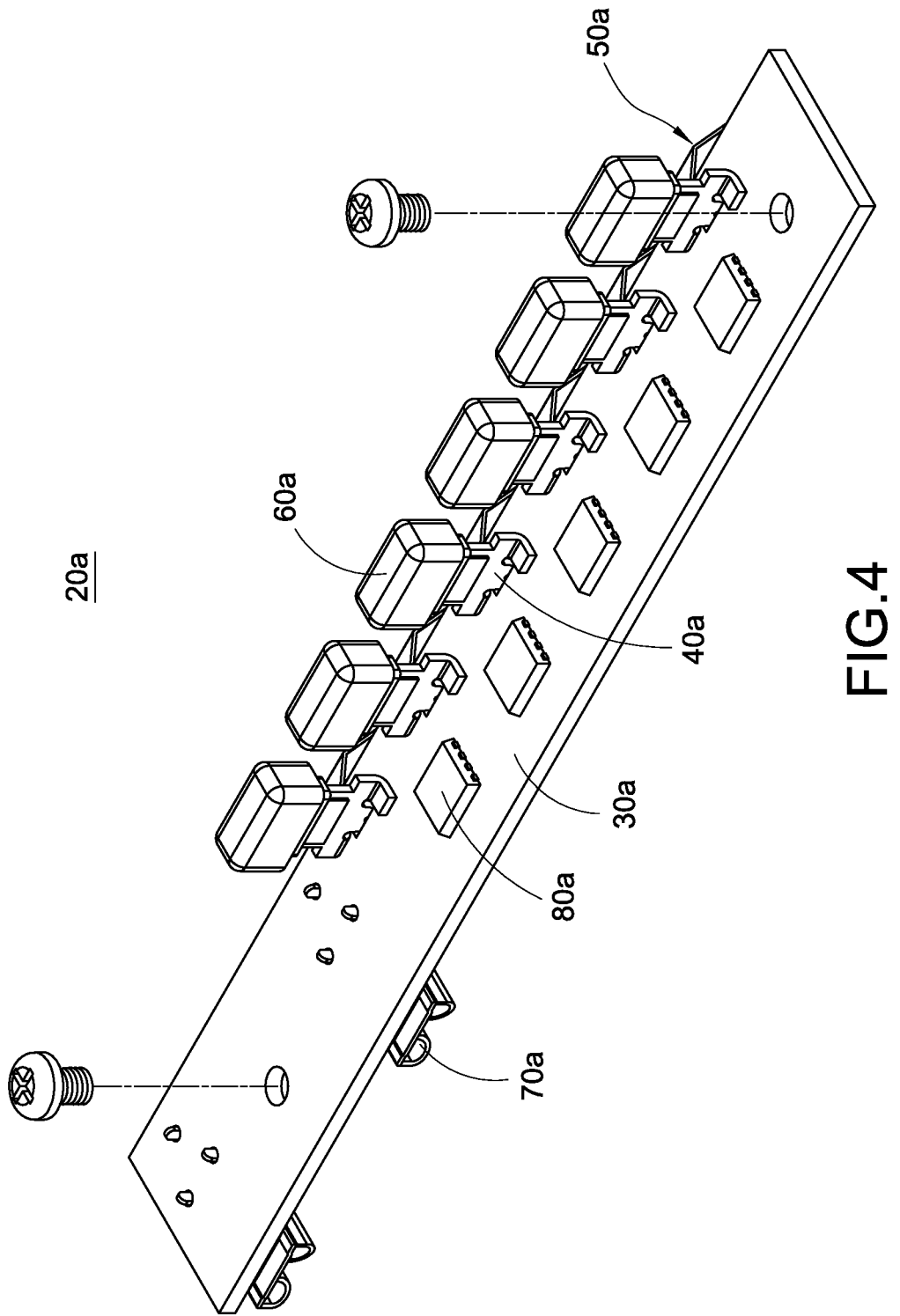

SOLAR JUNCTION BOX AND WIRE CONNECTING STRUCTURE THEREOF

FIELD OF THE INVENTION

The present invention relates to a peripheral of a solar panel, and more particularly to a solar junction box and a wire connecting structure of the solar junction box.

BACKGROUND OF THE INVENTION

Solar power generation has become one of the important developing industries of energy saving and environmental protection. At present, the solar power generation technology primarily converts light energy into electric energy through a solar panel and then transmits the electric energy generated by the solar panel to the outside through a wire. In addition, the electric energy generated by the solar panel is transmitted to other electric power storage devices through a solar junction box.

In general, the structure of a solar junction box of a solar module comprises a hollow square-shaped box body, a printed circuit board installed in the box body, and a plurality of wire connecting devices installed on the printed circuit board, wherein the wire connecting devices are used for connecting a solar panel and two external conducting terminals. However, the volume of this solar junction box is too large, and thus the installed solar panel will occupy some of the using areas of the solar panel. Furthermore, the wire of the solar panel may be separated and electrically disconnected from the wire connecting devices easily, and thus resulting in high maintenance frequency and low working efficiency.

In view of the aforementioned problems, the inventor of the present invention based on years of experience in the related industry to conduct extensive researches and experiments to develop and design a solar junction box and a wire connecting structure of the solar junction box to overcome the aforementioned problems of the prior art.

SUMMARY OF THE INVENTION

Therefore, it is a primary objective of the present invention to provide a solar junction box and a wire connecting structure of the solar junction box to reduce the volume of the solar junction box and provide a stable electrical connection.

Another objective of the present invention is to provide a solar junction box and a wire connecting structure of the solar junction to reduce the maintenance frequency and improve the working efficiency of the solar panel.

To achieve the aforementioned objectives, the present invention provides a wire connecting structure of a solar junction box used for connecting two conducting terminals, and the wire connecting structure comprises a printed circuit board, a plurality of first conductive tongues, a plurality of solar panel conducting plates, a plurality of insulators and a pair of second conductive tongues. The first conductive tongues are separated from one another and perpendicularly plugged onto the printed circuit board. The solar panel conducting plates are combined to the first conductive tongues respectively, and each of the solar panel conducting plates includes an extension plate coupled to the solar panel and a U-shaped snap-in plate bent and extended from the extension plate, and each of the U-shaped snap-in plates is sheathed on each of the corresponding first conductive tongues. The insulators are sheathed on the solar panel conducting plates respectively. The pair of second conductive tongues are separated from each other and flatly attached onto a side of the printed circuit board, and the two conducting terminals are respectively and electrically coupled to the pair of second conductive tongues.

To achieve the aforementioned objectives, the present invention provides a solar junction box comprising a casing and a wire connecting structure of the solar junction box. The wire connecting structure of the solar junction box is installed in the casing. The wire connecting structure comprises a printed circuit board, a plurality of first conductive tongues, a plurality of solar panel conducting plates, a plurality of insulators and a pair of second conductive tongues. The first conductive tongues are separated apart from one another and perpendicularly plugged onto the printed circuit board. The solar panel conducting plates are combined to the first conductive tongues respectively, and each of the solar panel conducting plates includes an extension plate coupled to the solar panel and a U-shaped snap-in plate bent and extended from the extension plate, and each U-shaped snap-in plates is sheathed on each corresponding first conductive tongue. The insulators are sheathed on the solar panel conducting plates respectively. The pair of second conductive tongues are separated from each other and flatly attached onto a side of the printed circuit board, and the two conducting terminals are respectively and electrically coupled to the pair of second conductive tongues.

Compared with the prior art, the wire connecting structure of the present invention comes with the design of perpendicularly plugging the first conductive tongue onto the printed circuit board, sheathing the solar panel conducting plate having the U-shaped snap-in plate on the first conductive tongue, and installing the insulator onto the solar panel conducting plate. Since the solar panel conducting plate and the first conductive tongue are combined perpendicularly to each other, the solar junction box of the present invention can reduce the width and volume substantially over the conventional horizontal design. In addition, the solar panel conducting plate is securely snapped onto the first conductive tongue through the U-shaped snap-in plate, so that the solar panel conducting plate will not be detached easily, and the solar panel conducting plate and the first conductive tongue of the printed circuit board can be combined securely and connected electrically to improve the practicality of the present invention.

BRIEF DESCRIPTION OF THE DRAWINGS

FIG. 4 is a perspective view of a wire connecting structure of a solar junction box according to another preferred embodiment of the present invention.

DESCRIPTION OF THE PREFERRED EMBODIMENTS

Figure 1:
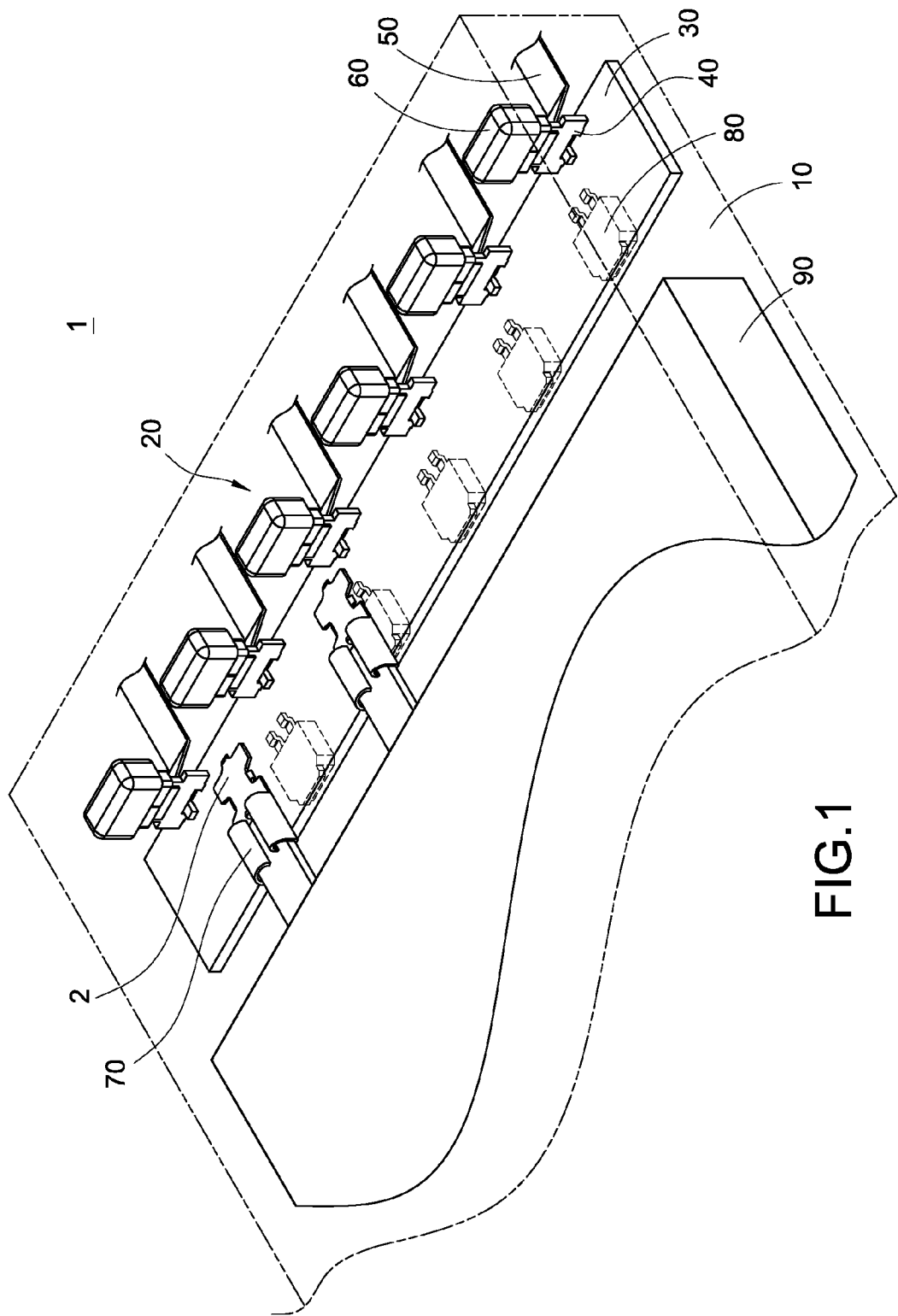
FIG. 1 is a perspective view of a solar junction box according to a preferred embodiment of the present invention.

The technical contents of the present invention will become apparent with the detailed description of preferred embodiments accompanied with the illustration of related drawings as follows. It is noteworthy that same numerals are used for representing same respective elements respectively in the drawings.

Figure 2:
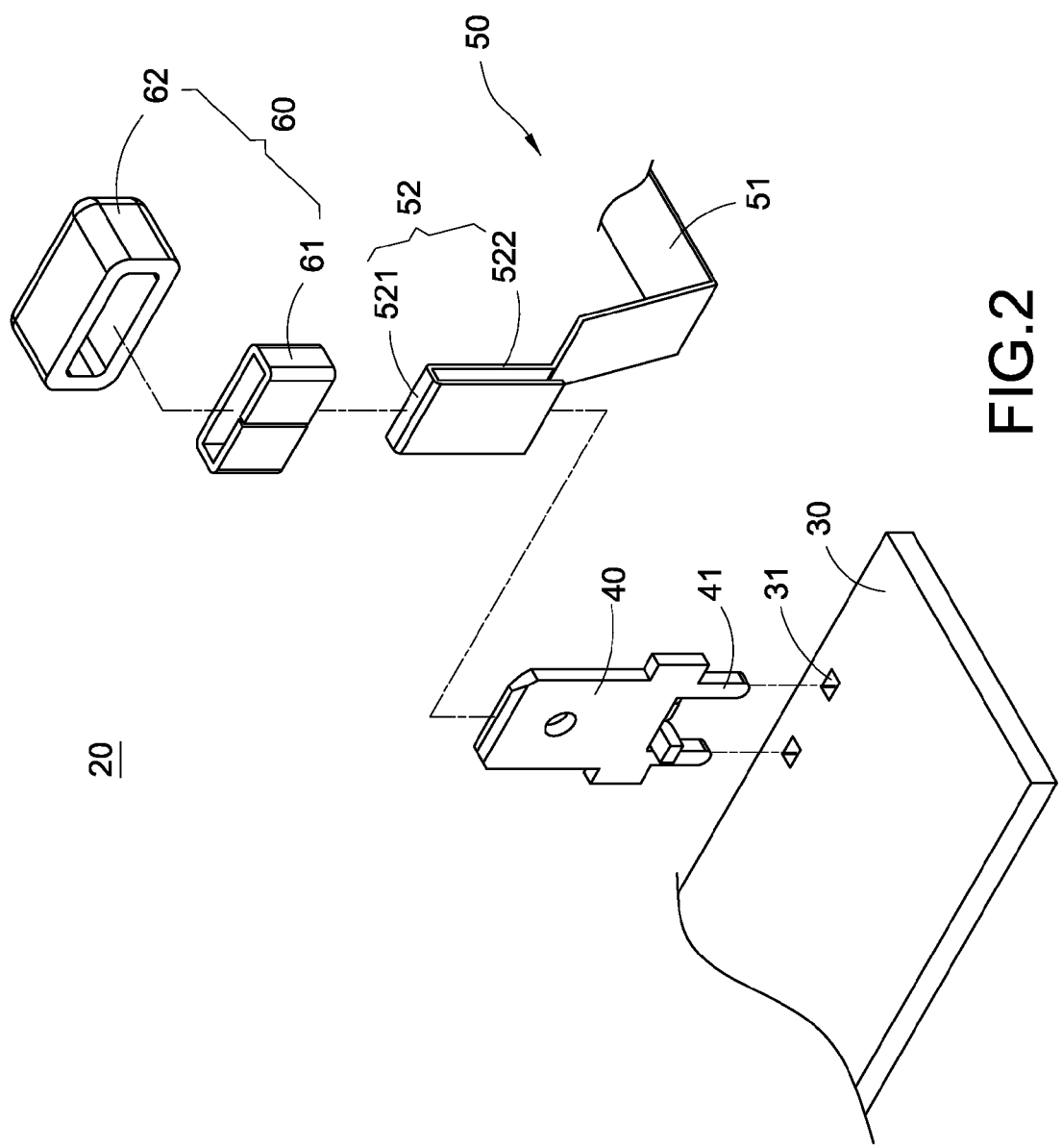
FIG. 2 is a partial exploded view of a wire connecting structure of a solar junction box according to a preferred embodiment of the present invention.
Figure 3:
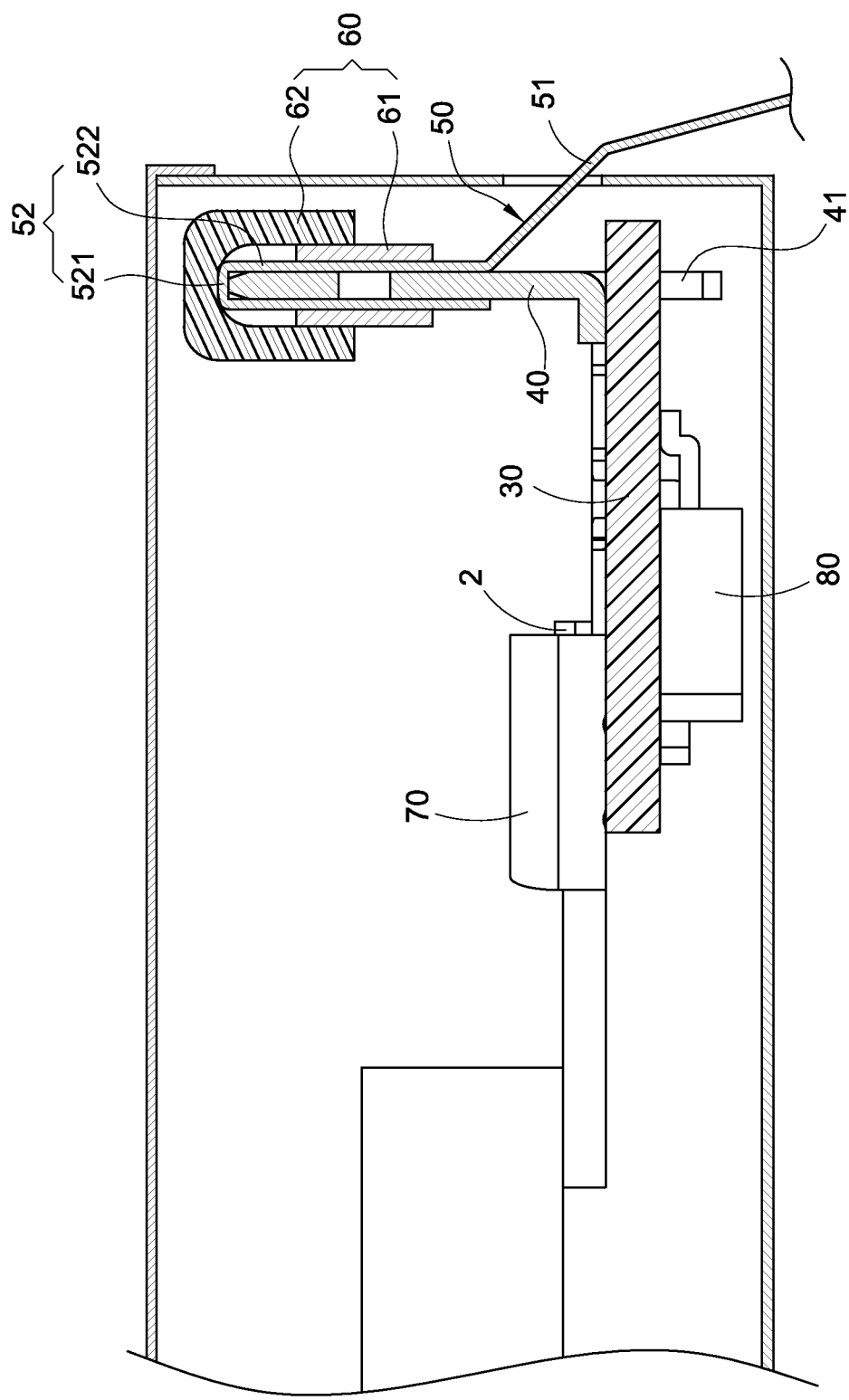
FIG. 3 is a sectional view of a wire connecting structure of a solar junction box according to a preferred embodiment of the present invention.

With reference to FIGS. 1 to 3 for a perspective view of a solar junction box, a partial exploded view and a sectional view of a wire connecting structure of the solar junction box according to a preferred embodiment of the present invention respectively, the solar junction box 1 comprises a casing 10 and a wire connecting structure 20. The wire connecting structure 20 is installed in the casing 10 to form the solar junction box 1.

The casing 10 covers the wire connecting structure 20 for protecting the wire connecting structure 20 against moisture and impacts by external forces. The wire connecting structure 20 comprises a printed circuit board 30, a plurality of first conductive tongues 40, a plurality of solar panel conducting plates 50, a plurality of insulators 60 and a pair of second conductive tongues 70. The first conductive tongues 40, the plurality of solar panel conducting plates 50, the plurality of insulators 60 and the pair of second conductive tongues 70 are installed on the printed circuit board 30.

Specifically, the first conductive tongues 40 are separated apart from one another and perpendicularly inserted onto the printed circuit board 30. The solar panel conducting plates 50 are combined onto the first conductive tongues 40 respectively. Each of the solar panel conducting plates 50 includes an extension plate 51 coupled to the solar panel (not shown in the figure) and a U-shaped snap-in plate 52 bent and extended from the extension plate 51. Each of the U-shaped snap-in plates 52 is snapped to each of the first conductive tongues 40.

The insulators 60 are sheathed on the solar panel conducting plates 50 respectively. The pair of second conductive tongues 70 are separated apart from each other and flatly attached onto a side of the printed circuit board 30. The wire connecting structure 20 of the present invention is provided for connecting two conducting terminals 2, wherein the two conducting terminals 2 are respectively and electrically coupled to the pair of second conductive tongues 70. Therefore, the electricity transmitted by the solar panel conducting plates 50 can be transmitted to the two conducting terminals 2 through the wire connecting structure 20, and finally transmitted through the two conducting terminals 2 to the outside for use or transmitted to other electric power storage devices.

Preferably, the wire connecting structure 20 further comprises a plurality of diodes 80. The diodes 80 are provided for preventing the occurrence of reverse voltage. In a preferred embodiment of the present invention, the first conductive tongues 40 and the pair of second conductive tongues 70 are installed on the same side of the printed circuit board 30, and the diodes 80 are installed on the other side of the printed circuit board 30 and disposed opposite to the pair of second conductive tongues 70.

In FIG. 1, the printed circuit board 30 includes a plurality of slots 31 corresponding to the first conductive tongues 40 respectively, and each of the first conductive tongues 40 has a plurality of pins 41 disposed at the bottom of the first conductive tongues 40, and the pins 41 are plugged into the slots 31 respectively to insert the first conductive tongue 40 perpendicularly onto the printed circuit board 30. In addition, the U-shaped snap-in plate 52 includes a stop plate 521 and two clip plates 522 disposed on both sides of the stop plate 521 respectively. The stop plate 521 abuts against the top side of the first conductive tongue 40, and the two clip plates 522 are attached onto both sides of the first conductive tongue 40 respectively.

In addition, each of the insulators 60 includes a socket ring 61 and a jacket 62. The socket ring 61 is a rectangular ring frame mounted onto the external side of the U-shaped snap-in plate 52. The jacket 62 is a semi-closed rectangular jacket covered onto the socket ring 61 and the top side of the U-shaped snap-in plate 52.

In a preferred embodiment of the present invention, the solar junction box 1 further comprises an inverter 90. The two conducting terminals 2 are disposed on a side of the inverter 90, and the electricity transmitted from the solar panel conducting plates 50 is transmitted to the outside through the two conducting terminals 2 and the inverter 90 or transmitted to other electric power storage devices.

With reference to FIG. 4 for a wire connecting structure of a solar junction box according to another preferred embodiment of the present invention, the wire connecting structure 20a comprises a printed circuit board 30a, a plurality of first conductive tongues 40a, a plurality of solar panel conducting plates 50a, a plurality of insulators 60a, a pair of second conductive tongues 70a and a plurality of diodes 80a. The first conductive tongues 40a, the plurality of solar panel conducting plates 50a, the plurality of insulators 60a, the pair of second conductive tongues 70a and the diodes 80a are installed on the printed circuit board 30a.

The difference between this preferred embodiment and the previous preferred embodiment resides on that the pair of second conductive tongues 70a and the first conductive tongues 40a of this preferred embodiment are disposed opposite to each other and installed on both sides of the printed circuit board 30a respectively. The diodes 80a are disposed opposite to the first conductive tongues 40a and installed on the same side of the printed circuit board 30a, and other components are substantially the same as those of the previous a preferred embodiment.

While the invention has been described by means of specific embodiments, numerous modifications and variations could be made thereto by those skilled in the art without departing from the scope and spirit of the invention set forth in the claims.

What is claimed is:

1. A wire connecting structure of a solar junction box, for connecting two conducting terminals, comprising:
    a printed circuit board;
    a plurality of first conductive tongues, separated apart from one another and perpendicularly plugged onto the printed circuit board;
    a plurality of solar panels conducting plates, combined to the first conductive tongues respectively, and each of the solar panel conducting plates including an extension plate coupled to the solar panel and a U-shaped snap-in plate bent and extended from the extension plate, and each of the U-shaped snap-in plates being sheathed on each of the corresponding first conductive tongues;
    a plurality of insulators, sheathed on the solar panel conducting plates respectively; and
    a pair of second conductive tongues, separated apart from each other and flatly attached onto a side of the printed circuit board, and the two conducting terminals being respectively and electrically coupled to the pair of second conductive tongues.

2. The wire connecting structure of a solar junction box according to claim 1, further comprising a plurality of diodes disposed opposite to the first conductive tongues and installed on the other side of the printed circuit board.

3. The wire connecting structure of a solar junction box according to claim 1, further comprising a plurality of diodes disposed on the same side of the first conductive tongues and installed on the printed circuit board.

4. The wire connecting structure of a solar junction box according to claim 1, wherein the printed circuit board includes a plurality of slots corresponding to the first conductive tongues respectively, and a plurality of pins disposed at the bottom side of each of the first conductive tongues and plugged into the slots respectively.

5. The wire connecting structure of a solar junction box according to claim 1, wherein the U-shaped snap-in plate includes a stop plate and two clip plates disposed on both sides of the stop plate respectively, and the stop plate abuts against the top side of the first conductive tongue, and the two clip plates are attached onto both sides of the first conductive tongue respectively.

6. The wire connecting structure of a solar junction box according to claim 1, wherein the insulator includes a socket ring mounted to the external side of the U-shaped snap-in plate.

7. The wire connecting structure of a solar junction box according to claim 6, wherein the insulator further includes a jacket covered onto the socket ring and the top side of the U-shaped snap-in plate.

8. The wire connecting structure of a solar junction box according to claim 7, wherein the socket ring is a rectangular ring frame, and the jacket is a semi-closed rectangular jacket.

9. A solar junction box having a wire connecting structure, for connecting two conducting terminals, comprising:
   a wire connecting structure, further comprising:
      a printed circuit board;
      a plurality of first conductive tongues, separated apart from one another and perpendicularly plugged onto the printed circuit board;
      a plurality of solar panels conducting plates, combined to the first conductive tongues respectively, and each of the solar panel conducting plates including an extension plate coupled to the solar panel and a U-shaped snap-in plate bent and extended from the extension plate, and each of the U-shaped snap-in plates being sheathed on each of the corresponding first conductive tongues; and
      a plurality of insulators, sheathed on the solar panel conducting plates respectively; and
      a pair of second conductive tongues, separated apart from each other and flatly attached onto a side of the printed circuit board, and the two conducting terminals being respectively and electrically coupled to the pair of second conductive tongues; and
   a casing, for installing the wire connecting structure therein.

10. The solar junction box of claim 9, further comprising an inverter, and the two conducting terminals are installed on the inverter.

11. The solar junction box of claim 9, wherein the wire connecting structure further comprises a plurality of diodes disposed opposite to the first conductive tongues and installed on the other side of the printed circuit board.

12. The solar junction box of claim 9, wherein the wire connecting structure further comprises a plurality of diodes disposed on the same side of the first conductive tongues and installed on the printed circuit board.

13. The solar junction box of claim 9, wherein the printed circuit board includes a plurality of slots corresponding to the first conductive tongues respectively, and a plurality of pins disposed at the bottom side of each of the first conductive tongues and plugged into the slots respectively.

14. The solar junction box of claim 9, wherein the U-shaped snap-in plate includes a stop plate and two clip plates disposed on both sides of the stop plate respectively, and the stop plate abuts against the top side of the first conductive tongue, and the two clip plates are attached onto both sides of the first conductive tongue respectively.

15. The solar junction box of claim 9, wherein the insulator includes a socket ring mounted to the external side of the U-shaped snap-in plate.

16. The solar junction box of claim 15, wherein the insulator further includes a jacket covered onto the socket ring and the top side of the U-shaped snap-in plate.

17. The solar junction box of claim 15, wherein the socket ring is a rectangular ring frame, and the jacket is a semi-closed rectangular jacket.

* * * * *